United States Patent [19]

Inoue et al.

[11] Patent Number: 4,584,548
[45] Date of Patent: Apr. 22, 1986

[54] MAGNETIC FIELD GENERATING COIL ASSEMBLY FOR NUCLEAR MAGNETIC RESONANCE IMAGING APPARATUS

[75] Inventors: Yuji Inoue; Hideto Iwaoka; Tadashi Sugiyama, all of Tokyo, Japan

[73] Assignees: Yokogawa Hokushin Electric Corporation; Yokogawa Medical Systems, Limited, both of Tokyo, Japan

[21] Appl. No.: 722,782

[22] Filed: Apr. 12, 1985

[30] Foreign Application Priority Data

Apr. 26, 1984 [JP] Japan ................................ 59-84765

[51] Int. Cl.⁴ ............................................. H01F 5/00
[52] U.S. Cl. ..................................... 335/299; 324/320
[58] Field of Search ............... 324/318, 319, 320, 321, 324/322; 335/299, 216

[56] References Cited

U.S. PATENT DOCUMENTS

| | | | |
|---|---|---|---|
| 4,320,342 | 3/1982 | Heinzerling | 324/320 X |
| 4,362,993 | 12/1982 | Young et al. | 324/320 X |
| 4,398,150 | 8/1983 | Barjhoux et al. | 324/319 |
| 4,509,011 | 4/1985 | Sugimoto et al. | 324/318 X |

Primary Examiner—George Harris
Attorney, Agent, or Firm—Moonray Kojima

[57] ABSTRACT

A coil assembly comprises four coils for generating a static magnetic field in an NMR imaging apparatus, wherein the dimensions of the coils are selected so that the flatness of the cross section of the coils, the current turns ratio, and the radius ratio, are within certain limits. The assembly so constructed produces highly uniform magnetic field, is small in size, and light-weight, and consumes a lower amount of power, and can be manufactured inexpensively.

2 Claims, 11 Drawing Figures r=0.33 r=2.0

MAGNETIC FIELD GENERATING COIL ASSEMBLY FOR NUCLEAR MAGNETIC RESONANCE IMAGING APPARATUS

BACKGROUND OF THE INVENTION

1. Field of the Invention

This invention relates to a magnetic field generating coil assembly for use in a nuclear magnetic resonance imaging apparatus.

2. Description of the Prior Art

Nuclear magnetic resonance (hereinafter referred to as "NMR") is effective in providing a microscopic understanding of substances in the fields of solid state physics and chemistry.

The NMR resides in a spectroscopic means which weakly coacts with a measured system through the use of a uniform static magnetic field and a weak RF magnetic field. The energy of the RF magnetic field normally used by the NMR ranges from $10^{-19}$ to $10^{-20}$ erg, which is substantially weaker than X-ray energy which is used in the range of from $10^{-8}$ to $10^{-10}$ erg.

These features of the NMR are of interest in the medical field since they provide an undestructive biological measuring technique. Particularly, its clinical application as an NMR-CT (computerized tomography) has been studied under the stimulus of the report by R. Damadian, Science Vol. 171, Page 1151 (1971), which discloses that the nuclear magnetic relaxation time of the hydrogen atomic nuclei of water molecules of a malignant tumor is several times longer than that of a normal tumor.

That NMR phenomenon is utilized in an NMR imaging apparatus for producing the image of a sectional plane of a subject to be examined. The NMR imaging apparatus ordinarily uses, as a static field generating coil, a normal conductivity magnetic assembly, such as shown in FIG. 1, for the reason that the illustrated magnet assembly performs well in examining human bodies.

For producing good images, the magnetic field uniformity in an imaging region should be of about 10 ppm. To meet this requirement, various designing methods have been heretofore proposed. The publication "NMR medicine" issued on Jan. 20, 1984 by the Society for the Research of NMR Medicine describes, on pages 78 and 89, the following designing method.

With the four coils disposed symmetrically as shown in FIG. 1, it is possible to eliminate all of the second, fourth and sixth term errors of the magnetic field. These coils are called double Helmholz coils, which are widely used in a normal conductivity NMR imaging magnet.

The conventional conditions for designing the foregoing coil system are as follows (see FIG. 1 for definitions of the symbols):

(A) Where the coils can approximate a concentrated current loop, the spacing between the coils are selected to be as follows:

$$\cos \theta_1 = z_1/R_0 = 0.76506$$

$$\cos \theta_2 = z_2/R_0 = 0.28523$$

The ratio of ampere turns of the coils is $$AT_2/AT_1 = 1.4660$$

At this time, the second, fourth, and sixth term errors of the magnetic field are all eliminated, providing an eighth compensating coil.

(B) With respect to double Helmholz coils having rectangular cross sections of finite dimensions, the following dimensions are selected:

$$\cos \theta_1 = z_1/R_0 = 0.76506$$

$$\cos \theta_2 = z_2/R_0 = 0.28523$$

The ratio of ampere turns of the coils is $$AT_2/AT_1 = 1.46608$$

If the current densities in the respective coils are equal, then $$a_1/a_2 = 0.67188$$

$$b_1/b_2 = 1.01523$$

The dimensions of coils, $a_1$, $a_2$, $b_1$, $b_2$ are selected to meet the relationship:

$$a_1, a_2, b_1, b_2 << R_0.$$

With the dimensions selected as above, the second and fourth term errors of the magnetic field are eliminated, providing a sixth compensating coil.

(C) With respect to double Helmholz coils having rectangular cross sections of finite dimensions, the dimensions for providing an eighth compensating coil are selected according to the below Table 1.

In the coil system thus designed, the magnetic field produced thereby is expressed by $$Bz(z,0) = B_0(1 + \gamma_8(z/R_0)^8 + \ldots)$$

In any case, the inner coils are vertically elongate with dimensions $a_2/b_2 \geq 1$. With these coils, the dimension (the maximum outer coil dimension of 1,600 mm), the power consumption (about 60 KW), and the weight (about 2000 Kg) are large, and the clear coil diameter C (defined by the diameter of the smaller coils) is small (about 700 mm).

TABLE 1

|  | Example 1 | Example 2 | Exaple 3 | Example 4 |
|---|---|---|---|---|
| $b_1/2R_O$ | 0.04206 | 0.09386 | 0.07503 | 0.08116 |
| $z_1/R_O$ | 0.76598 | 0.76847 | 0.76346 | 0.76015 |
| $z_2/R_O$ | 0.28501 | 0.28519 | 0.28638 | 0.28700 |
| $Nb_1$ | 32 | 20 | 15 | 15 |
| $Na_1$ | 16 | 15 | 20 | 24 |
| $Nb_2$ | 25 | 20 | 21 | 23 |
| $Na_2$ | 30 | 22 | 21 | 23 |
| $\gamma_8$ | −2.106 | −2.101 | −2.083 | −2.080 |

SUMMARY OF THE INVENTION

Accordingly, an object of the invention is to provide a coil assembly for generating a highly uniform static magnetic field, which coil assembly is small in size, light in weight, consumes a a reduced amount of electric power, and is inexpensive to manufacture.

According to the invention, there is provided a coil assembly for generating a magnetic field, comprising a pair of inner coils and a pair of outer coils with dimensions selected to meet the following conditions:

a/b of the inner coil = a/b ≦ 0.4 a/b of the outer coil = a/b ≦ 1.0

$0.6 \leq r_c \leq 1.0$ $0.8 \leq R_1/R_s \leq 1.2$ wherein a/b is the cross sectional flatness; $r_c$ is the ratio of the product of a current in the outer coil and the number of turns thereof with respect to the product of a current in the inner coil and the number of turns thereof; and $R_1/R_s$ is the ratio of the radius of the outer coil about the center of the cross section thereof with respect to the radius of the inner coil about the center of the cross section thereof; and wherein the Taylor expansion of an axial magnetic field at the center of the coils having eliminated second, fourth and sixth terms thereof.

DETAILED DESCRIPTION OF PREFERRED EMBODIMENTS

Figure 2:
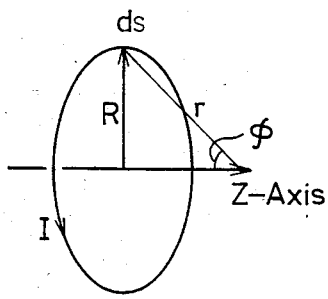
FIGS. 2 and 3 are diagrams which explain the relationship between loop current and magnetic field.

Principles of the Invention (I) Based on the Biot-Savart law, the component in the z direction of the magnetic field H(z) produced on the z axis by a loop current, as shown in FIG. 2, is expressed as follows:

$$dH(z) = d \quad \sin\phi = \frac{I}{4\pi r^2} \frac{R}{r} ds$$

Hence $$H(z) = \int d = IR^2/2(R^2+Z^2)^{3/2} \quad (1)$$

wherein
R = the radius of the loop
s = the length along the loop.
H = the vector of the magnetic field.
φ = the angle between ds and the Z axis on an arbitrary point on the Z axis.
r = the distance from the arbitrary point on the X axis to ds.
I = the current.

Figure 3:
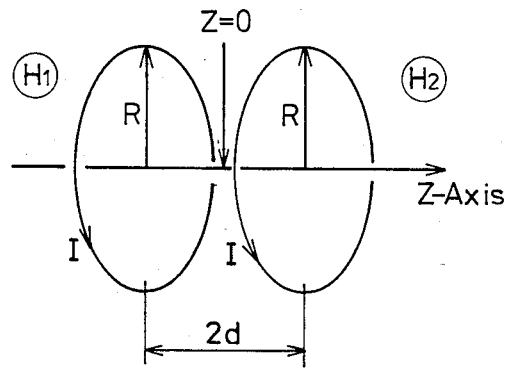

(II) As shown in FIG. 3, two loop currents are positioned parallel to each other at the spacing of 2d. With the two coils having their center at z=0, the magnetic field $H_1$, $H_2$ produced by the respective coils are given by $$H_1(z) = H(z-d) \quad (2)$$

$$H_2(z) = H(z+d) \quad (3)$$

By subjecting equations (2) and (3) to Taylor expansion with z=0, and expressing them by using H(z), they are converted into the following equations (4) and (5), respectively.

$$H_1(z) = H_1(0) + \frac{\partial H_1(0)}{\partial z} \cdot z + \frac{1}{2} \frac{\partial^2 H_1(0)}{\partial z^2} \cdot z^2 + \ldots \quad (4)$$

$$= H(d) - \frac{\partial H(d)}{\partial z} \cdot z + \frac{1}{2} \frac{\partial^2 H(d)}{\partial z^2} \cdot z^2 - \ldots$$

$$H_2(z) = H_2(0) + \frac{\partial H_2(0)}{\partial z} \cdot z + \frac{1}{2} \frac{\partial^2 H_2(0)}{\partial z^2} \cdot z^2 + \ldots \quad (5)$$

$$= H(d) + \frac{\partial H(d)}{\partial z} \cdot z + \frac{1}{2} \frac{\partial^2 H(d)}{\partial z^2} \cdot z^2 + \ldots$$

Since the magnetic field produced by the two loop currents is expressed by $H_1+H_2$, equations (4) and (5) are added together to obtain $$H_1(z) + H_2(z) = 2H(d) + \frac{\partial^2 H}{\partial z^2}(d) \cdot z^2 + \frac{2}{4!} \frac{\partial^4 H(d)}{\partial z^4} z^4 + \quad (6)$$

$$\ldots + \frac{2}{n!} \frac{\partial^n H(d)}{\partial z^n} \cdot z^n + \ldots \text{ (n is an even number)}$$

Therefore, the terms of z to the odd numbered powers are eliminated.

Thus, where the coils are disposed symmetrically with z=0 only the terms of z to the even numbered powers remain in the Taylor expansion at z=0.

The coefficients are specifically calculated from the equation (1) as indicated by equations (7), (8) and (9). For easier understanding, x=z/R and the term of ½ and 1/n! are omitted.

$$\text{2nd coefficient} = \frac{3}{R^3}(4x^2 - 1)(1 + x^2)^{-7/2} \quad (7)$$

$$\text{4th coefficient} = \frac{45}{R^5}(8x^4 - 12x^2 + 1)(1 + x^2)^{-11/2} \quad (8)$$

$$\text{6th coefficient} = \frac{315}{R^7}(64x^6 - 240x^4 + 120x^2 - 5)(1 + x^2)^{-15/2} \quad (9)$$

(III) While the linear currents have been described, four coils having finite cross sectional areas can be analyzed in the same manner. As with the case of the two coils, only the terms of z to the even numbered powers appear in the Taylor expansion of the magnetic field at z=0. The coefficients can be obtained by adding (integrating) linear currents which are regarded as being distributed in a cross sectional plane.

(IV) The Taylor expansion of the magnetic field at z=0 is obtained in the manner described above. A magnetic field h(z) produced on the z axis by four coils having finite cross sectional areas can be expanded according to equation (10) at z=0.

$$h(z) = a_0 + a_2 z^2 + a_4 z^4 + a_6 z^6 + \ldots \quad (10)$$

If |z| < 1, the $$|z|^n < |z|^m \quad (n<m)$$

Therefore, those coefficients at lower degrees are more responsible for affecting the uniformity of the magnetic field.

By determining the shape so that the three terms of $|a_2|$, $|a_4|$, $|a_6|$ (or $(|a_2|^2+|a_4|^2+|a_6|^2)^{\frac{1}{2}}$ will be minimized, the coils can produce a static magnetic field which is highly uniform.

REFERENCES FOR EVALUATING A STATIC MAGNETIC FIELD (i) The following four functions are generally used for evaluating magnets.

(1) The uniformity and region of a magnetic field.
(2) The weight of a coil.
(3) The amount of consumed power.
(4) The clear bore diameter.

If the coil weight is reduced, then the consumed power is increased. If the clear bore diameter is increased, then the coil weight and the consumed power become larger. Since the above four evaluating factors are not directly proportional to each other, and some contradict another, it is not simple to evaluate the performance of a megnet from more consideration of data obtained from these four factors (i)(1) through (i)(4).

With the static magnetic field magnet, however, uniformity is required and the magnetic field intensity is limited. Accordingly, the above data items (i)(2), (i)(3) and (i)(4) should be compared under conditions which produce the same magnetic field intensity in the same uniformity region (for example, in which the uniformity is 10 ppm or less).

(ii) As a consequence, the following new evaluating factor or function has been introduced.

Within the range in which the coil shape is not largely changed, the product of the coil weight and the consumed power remains constant.

Consumed power $= P = I^2(2\pi R/S)\rho \cdot N$

Weight $= W = S \cdot 2\pi R \cdot N \cdot \delta$

Hence, $$P \times W = I^2(2\pi R)^2 \cdot N^2 \cdot \rho \cdot \delta$$
$$= (\text{ampere turns})^2 \cdot (2\pi R)^2 \cdot \rho \cdot \delta$$

wherein
I = the current
S = the cross sectional area of a single wire.
$\rho$ = the resistivity of the wire.
N = the number of turns of wire.
$\delta$ = the weight of the wire per unit volume.
R = the diameter of a coil.

Accordingly, the smaller the product of the consumed power and the coil weight, and the larger the clear bore diameter, the better the static magnetic field coil.

The formula or factor (consumed power multiplied by the coil weight $= P \times W$) is therefore used as an important evaluating function.

Figure 1:
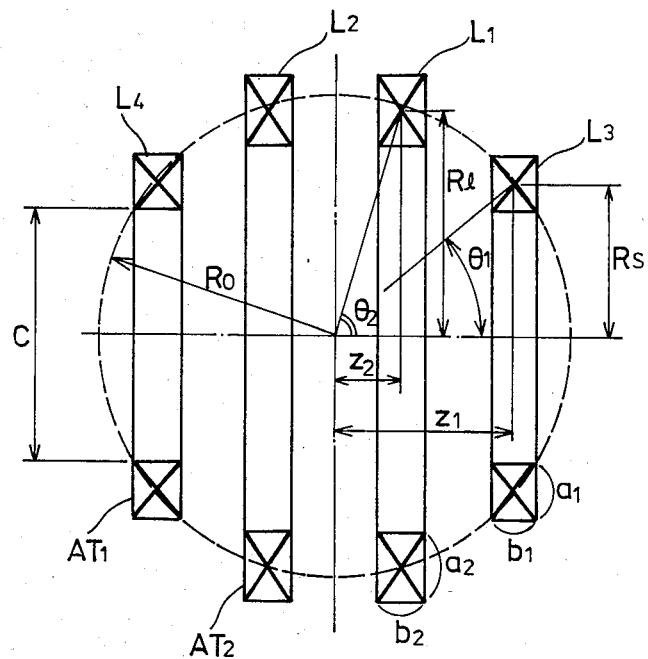
FIG. 1 is a view of a conventional static magnetic field generating coil assembly.

RELATIONSHIP BETWEEN COIL SHAPES AND CHARACTERISTICS (a) Where the cross sectional area of a coil is relatively small as compared to the overall coil. The four coils are divided into inner and outer coils. Similar to the configuration of FIG. 1, the two inner coils are identical in shape, and so are the two outer coils. The inner and outer coils have different numbers of wire turns. Equal currents are passed through the wires of the inner and outer coils.

Figure 4:
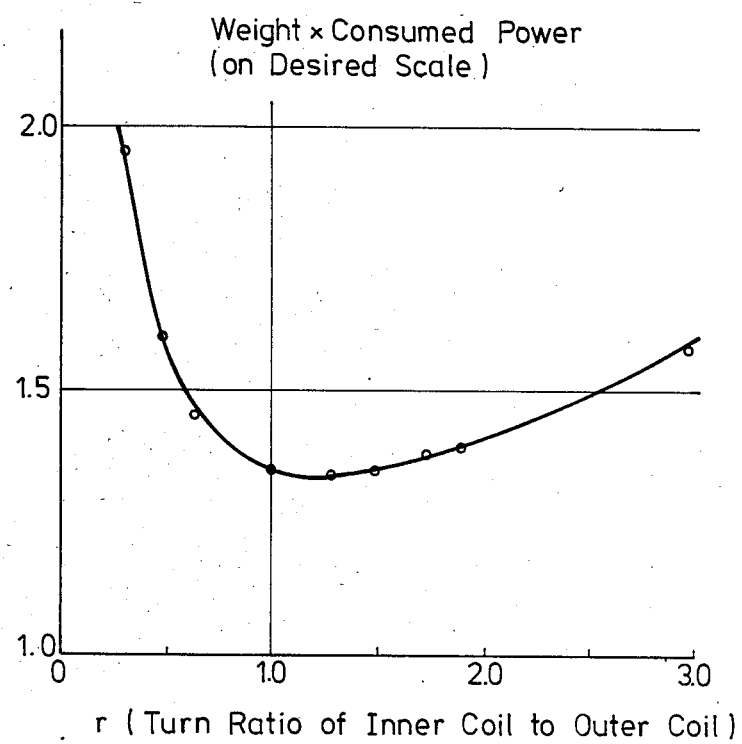
FIGS. 4 through 9 are diagrams dipicting the relationship between coil shapes and characteristics.

FIG. 4 shows how the factor (weight multiplied by consumed power) varied with respect to the ratio (hereinafter referred to as $\gamma$) of the turns of the inner coil to the turns of the outer coil. As is apparent from FIG. 4, the factor (weight multiplied by consumed power) is minimized in the vicinity of $\gamma = 1.0$ through 1.5.

Figure 5A:
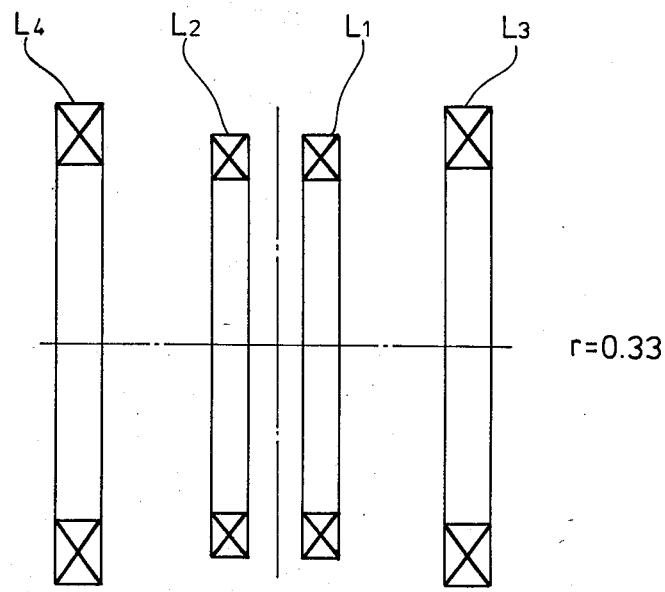
Figure 5B:
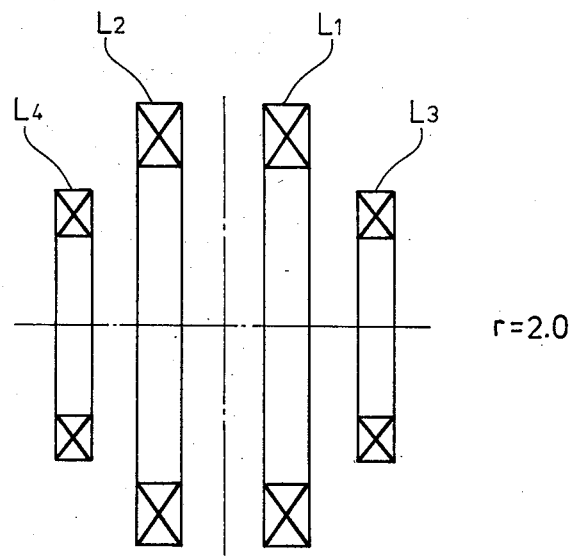

FIGS. 5(a) and 5(b) show different coils shapes with respect to the ratio.

(b) Where the cross sectional area of the coil is so large as compared with the entire coil, that it is not negligible, the cross sectional shape affects the characteristics of the coil as the magnet. Most of the actual coils used fall under this category.

Figure 6:
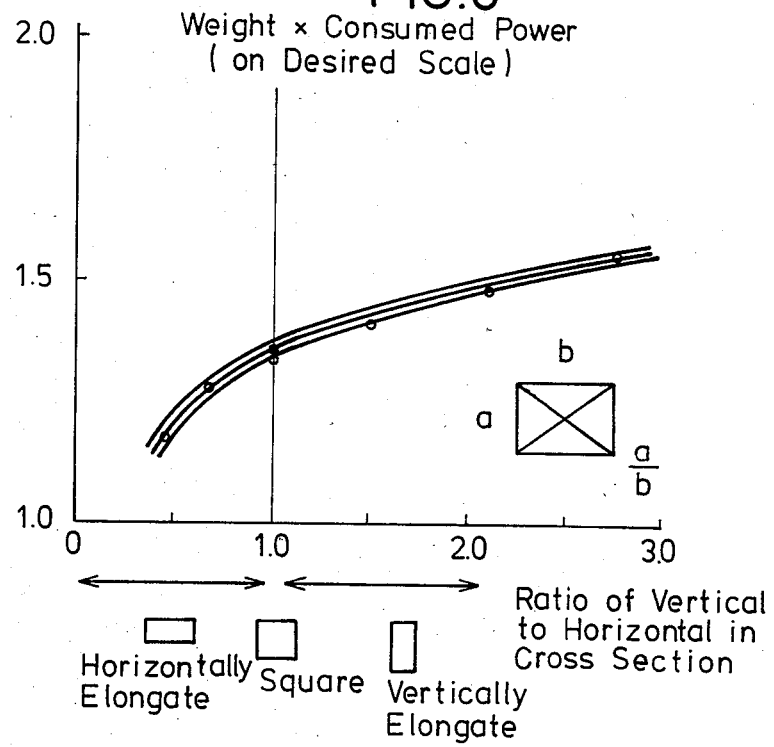

FIG. 6 shows the manner in which the factor (weight multiplied by the consumed power) is varied when the cross sectional shape of the coil is changed from a horizontal elongate shape to a vertically elongate shape. FIG. 6 indicates that the horizontally elongate shape is better than the vertically elongate shape for the reason that the diameter of the coil with the horizontally elongate cross section is smaller as a whole. The difference between the shapes of the outer coils does not essentially affect the characteristics.

Figure 7:
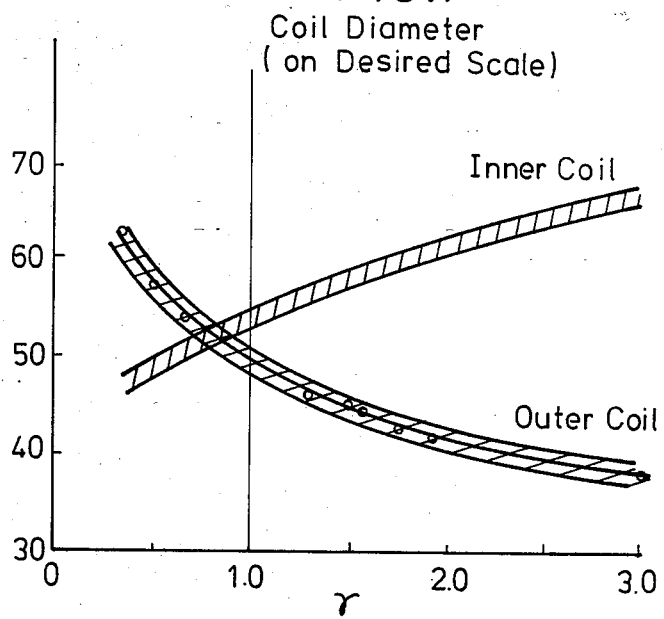
Figure 8:
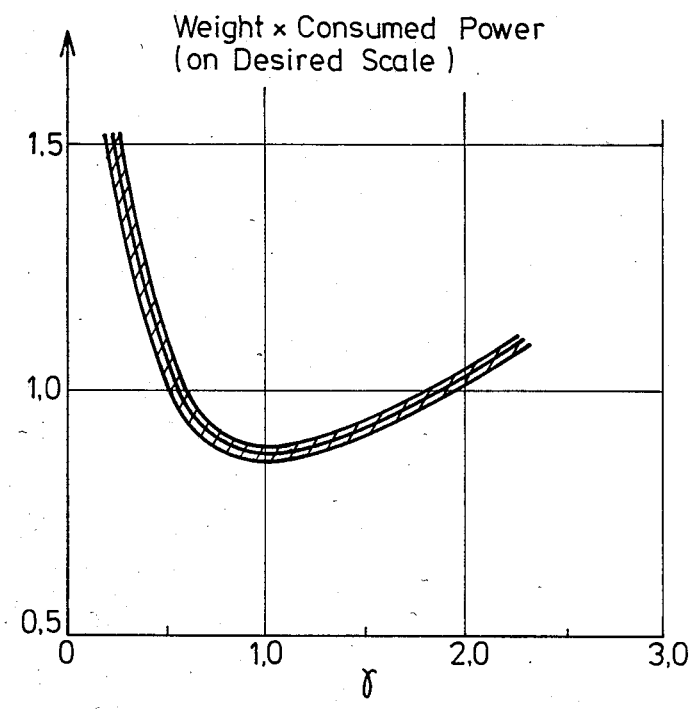

(c) FIGS. 7 and 8 show a combination of the varying cross sectional shape of the coil as described above in item (b) and the varying $\gamma$ as described above in item (a). FIG. 7 indicates how the diameters of the inner and outer coils vary with respect to $\gamma$. At $\gamma = 0.6$ through 1.0, the diameters of the outer and inner coils are substantially equal to each other and the clear bore diameter is at maximum.

FIG. 8 indicates how the factor (weight multiplied by consumed power) varies with respect to $\gamma$. As with FIG. 7, the factor (weight multiplied by consumed power) is maximum at $\gamma = 0.6$ through 1.2. In FIGS. 7 and 8, the inner coil has a horizontally elongate cross section.

Figure 9:
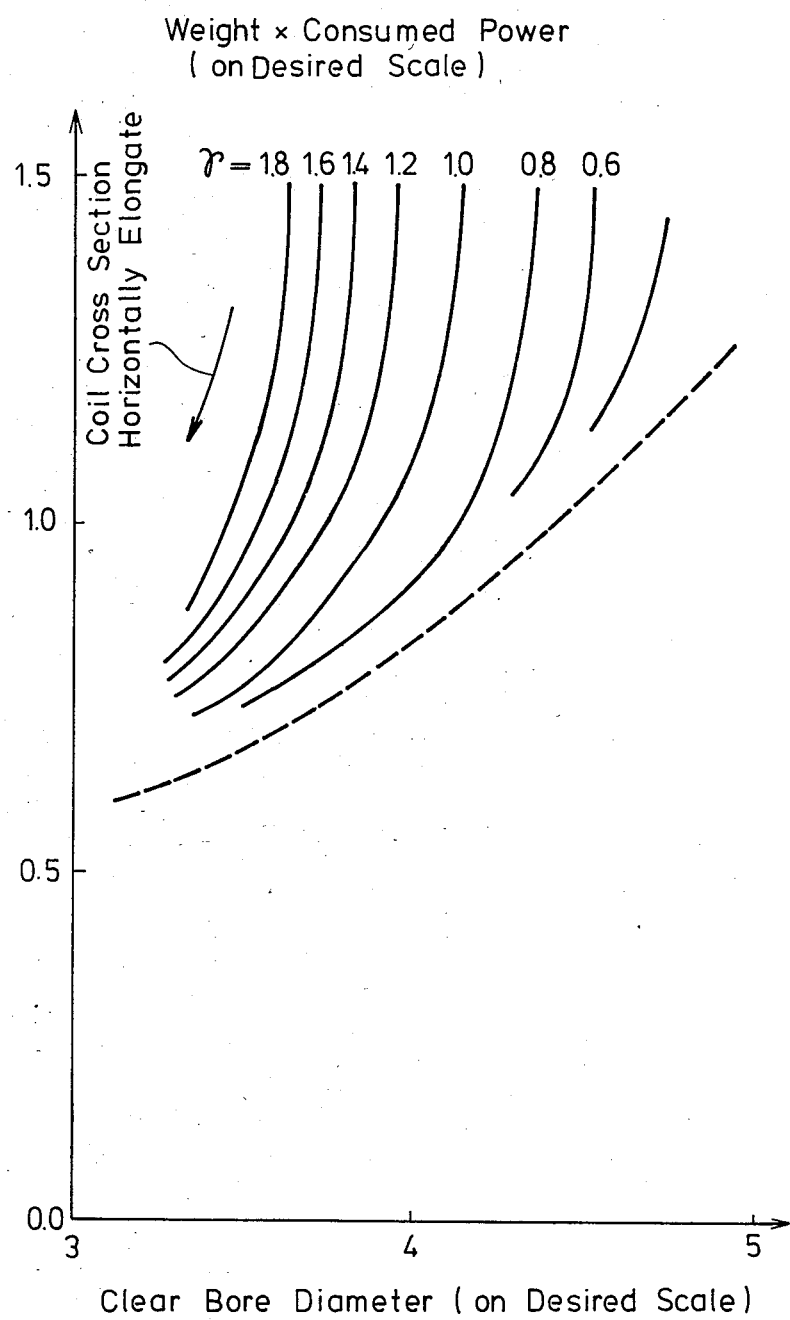

FIG. 9 shows the relationship between the clear bore diameter and the factor (weight multiplied by consumed power). That factor is progressively lowered along the solid line curves in FIG. 9. If the cross sectional shape of the inner coils were too horizontally elongate, the inner coils would interfere with each other. The dotted line curved in FIG. 9 represents a limitation on the horizontal elongation of the cross section of the inner coils. As can be understood from FIG. 9, when a certain clear bore diameter is selected, which minimizes the factor (weight multiplied by consumed power) is uniquely determined. The inner coils should be horizontally elongate to an extent just short of mutual contact.

Figure 10:
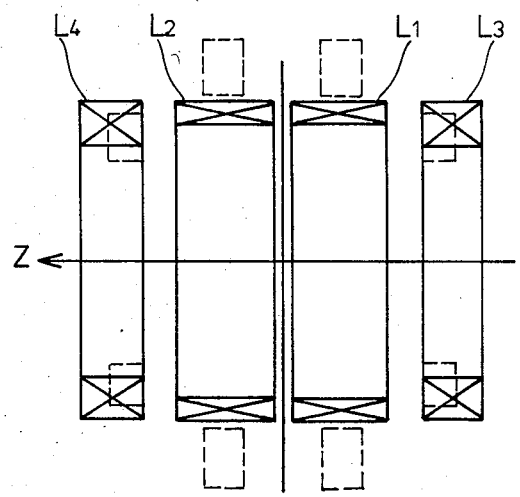
FIG. 10 is a view of a coil assembly according to the invention.

FIG. 10 shows in cross section, a coil assembly according to the invention. Indicated by dotted lines is a conventional coil assembly. Table 2 shows characteristic dimensions and properties of an illustrative embodiment of the invention as compared with a conventional coil assembly. The coil assembly having the dimensions of Table 2 provide a magnet which can produce a uniform magnetic field in a large region, is small in size, light in weight, and consumes a lower amount of electric power than the conventional assemblies. Other dimensions may be selected within the ranges set forth below to produce magnet assemblies which have similar advantageous properties.

The inventors have discovered that coils having the following ranges would produce the aforementioned and other advantages.

$$a/b \text{ of the inner coil} = a/b \leq 0.4.$$

$$a/b \text{ of the outer coil} = a/b \leq 1.0.$$

$$0.6 \leq r_c \leq 1.0.$$

$$0.8 \leq R_1/Rs \leq 1.2$$

wherein
- $a/b$ = the flatness ratio of the coil cross section.
- $r_c$ = the ratio of the current x number of turns in the inner coil to the current x number of turns in the outer coil.
- $R_1/Rs$ = the ratio of the radius of the inner coil to the radius of the outer coil.

The coil assembly will satisfy the condition wherein the Taylor expansion of an axial magnetic field at the center of the coil has eliminated the second, fourth and sixth terms.

The coil assembly of FIG. 10 has dimensions which conform to the above ranges, and in one illustrative embodiment have dimensions shown in below Table 2.

TABLE 2

|  | Prior Coil | Invention Coil |
| --- | --- | --- |
| Depth | 1133 mm | 1200 mm |
| Width (height) | 1608 mm | 1100 mm |
| Clear Bore diameter | 700 mm ⌀ | 800 mm ⌀ |
| Weight | 2000 Kg | 1900 Kg |
| Consumed Power (40° C.) | 60.0 KW | 47.0 KW |
| Uniform region |  |  |
| Diametrical | 350 mm | 350 mm |
| z direction | 100 mm | 300 mm |
| Magnetic Field |  |  |
| intensity | 1500 Gauss | 1500 Gauss |

With the arrangement of the invention, a normal conductivity coil assembly comprising four coils for generating a static magnetic field is advantageously small in size, lightweight, and consumes a low amount of electric power. The inner and outer coils are constructed to be of selected dimensions so that the flatness ratio of the cross section, the current ratio, and the coil radius ratio, meet the above prescribed ranges.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A coil assembly for generating a magnetic field comprising a pair of inner coils and a pair of outer coils, each of said coils having dimensions which satisfy the following ranges $$a/b \text{ of the inner coil} = 0.4;$$

$$a/b \text{ of the outer coil} = 1.0;$$

$$0.6 = r_c = 1.0; \text{ and}$$

$$0.8 = R_1 Rs = 1.2;$$

wherein $a/b$ is ratio of cross sectional flatness, $r_c$ is ratio of product of current in the outer coil and number of turns thereof with respect to product of current in the inner coil and number of turns thereof; and $R_1/Rs$ is ratio of radius of the inner coil with respect to radius of the outer coil; and wherein a Taylor expansion of an axial magnetic field at the center of said inner coils and outer coils has eliminated second, fourth and sixth terms.

2. The assembly of claim 1, wherein said coils have the dimensions, depth 1200 mm, width 1100 mm, clear bore diameter 800 mm, weight 1900 Kg, and consumed power 47.0 Kw, at 1500 Gauss magnetic field intensity.

* * * * *